(12) United States Patent
Tangen et al.

(10) Patent No.: US 6,765,617 B1
(45) Date of Patent: Jul. 20, 2004

(54) OPTOELECTRONIC CAMERA AND METHOD FOR IMAGE FORMATTING IN THE SAME

(76) Inventors: Reidar E. Tangen, Herregårdsveien 57, N-1168, Oslo (NO); Hans Gude Gudesen, c/oK. Gudesen. Hans Petters vei 7, N-1639, Gamle Fredrikstad (NO); Per-Erik Nordal, Båstadryggen 19 N-1370, Asker (NO); Geirr I. Leistad, Jongsstubben 19, N-1300, Sandvika (NO)

(*) Notice: Subject to any disclaimer, the term of this patent is extended or adjusted under 35 U.S.C. 154(b) by 0 days.

(21) Appl. No.: 09/341,311
(22) PCT Filed: Nov. 13, 1998
(86) PCT No.: PCT/NO98/00339
§ 371 (c)(1),
(2), (4) Date: Jul. 8, 1999
(87) PCT Pub. No.: WO99/26419
PCT Pub. Date: May 27, 1999

(30) Foreign Application Priority Data

Nov. 14, 1997 (NO) .............................................. 975251

(51) Int. Cl.$^7$ ............................................. H04N 5/225
(52) U.S. Cl. ...................................................... 348/340
(58) Field of Search .............................. 348/219.1, 340

(56) References Cited

U.S. PATENT DOCUMENTS

| | | | |
|---|---|---|---|
| 3,824,609 A | | 7/1974 | Tevick .......................... 396/307 |
| 4,460,919 A | | 7/1984 | Takemura ..................... 348/277 |
| 4,477,832 A | | 10/1984 | Takemura ..................... 348/277 |
| 4,589,029 A | * | 5/1986 | Torimaru et al. ....... 348/333.12 |
| 4,633,317 A | * | 12/1986 | Uwira et al. ............. 348/219.1 |
| 4,876,590 A | | 10/1989 | Parulski ....................... 348/281 |
| 4,998,800 A | * | 3/1991 | Nishida et al. .............. 359/569 |
| 5,091,795 A | * | 2/1992 | Nishioka et al. ................ 349/1 |
| 5,151,790 A | * | 9/1992 | Takatori et al. ............. 348/335 |
| 5,172,234 A | * | 12/1992 | Arita et al. ............... 348/240.2 |
| 5,249,041 A | | 9/1993 | Shiraishi .................... 348/224.1 |
| 5,251,019 A | | 10/1993 | Moorman et al. ........... 348/275 |
| 5,461,418 A | * | 10/1995 | Shiraishi ...................... 348/291 |
| 5,497,269 A | * | 3/1996 | Gal .............................. 359/615 |
| 5,566,007 A | * | 10/1996 | Ikeda et al. ..................... 349/5 |
| 5,682,266 A | * | 10/1997 | Meyers ......................... 359/571 |
| 5,696,371 A | * | 12/1997 | Meyers ...................... 250/208.1 |
| 5,751,492 A | * | 5/1998 | Meyers ......................... 359/619 |
| 5,973,844 A | * | 10/1999 | Burger ......................... 359/622 |
| 6,016,224 A | * | 1/2000 | Namiki ........................ 359/619 |
| 6,137,535 A | * | 10/2000 | Meyers ......................... 348/340 |
| 6,141,048 A | * | 10/2000 | Meyers ......................... 348/294 |
| 6,449,023 B2 | * | 9/2002 | Swanson et al. .............. 349/62 |

FOREIGN PATENT DOCUMENTS

JP 06-121306 A * 4/1994 ............ H04N/7/15

* cited by examiner

Primary Examiner—Andrew Christensen
Assistant Examiner—Tia M. Harris
(74) Attorney, Agent, or Firm—Birch, Stewart, Kolasch, & Birch, LLP.

(57) ABSTRACT

An optoelectronic camera comprises an objective system formed by a number of optical active structures (L), particularly refractive structures in the form of microlenses or lenslets provided in an array. A detector device (D) is assigned to the lens array and comprises detectors ($D_n$) formed by sensor elements (E) which define pixels in the optical image. Each detector ($D_n$) defines a sample of the optical image and optimally all samples are used to generate a digital image. The optoelectronic camera may be realized as a color image camera, particularly for recording images in an RGB system. In a method for digital electronic formatting of an image recorded with the optoelectronic camera, zoom and pan functions are implemented in the camera.

42 Claims, 8 Drawing Sheets

Figure 1A:
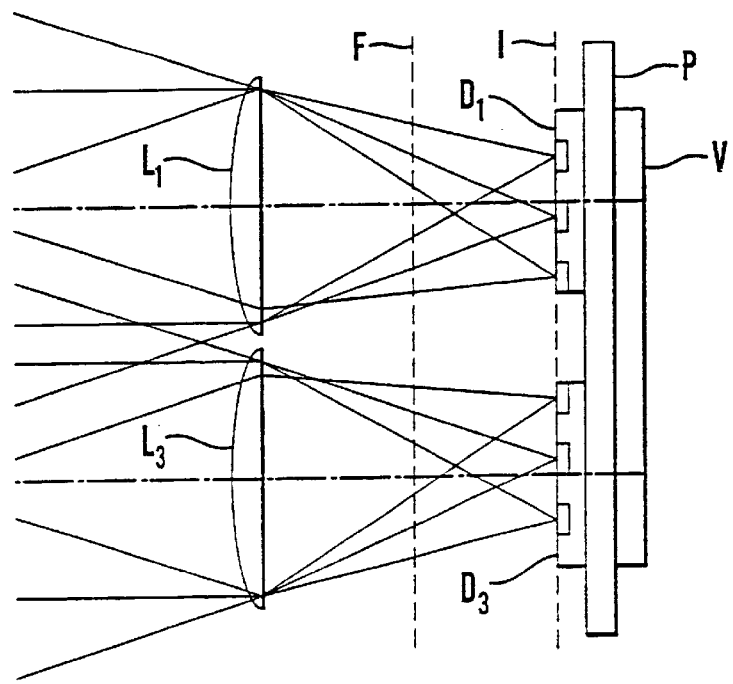

| R | R | R | R | R | R |
|---|---|---|---|---|---|
| G | G | G | G | G | G |
| B | B | B | B | B | B |
| R | R | R | R | R | R |
| G | G | G | G | G | G |
| B | B | B | B | B | B |

Fig.6

| Cy | Ye | Cy | Ye | Cy | Ye |
|----|----|----|----|----|----|
| Gr | Mg | Gr | Mg | Gr | Mg |
| Cy | Ye | Cy | Ye | Cy | Ye |
| Gr | Mg | Gr | Mg | Gr | Mg |
| Cy | Ye | Cy | Ye | Cy | Ye |
| Gr | Mg | Gr | Mg | Gr | Mg |

Fig.7

OPTOELECTRONIC CAMERA AND METHOD FOR IMAGE FORMATTING IN THE SAME

This application is the national phase under 35 U.S.C. §371 of PCT International Application No. PCT/NO98/00339 which has an International filing date of Nov. 13, 1998 which designated the United States of America.

The present invention concerns an optoelectronic camera comprising an optical objective system for imaging a scene recorded by the camera as an optical image substantially in an image plane of the objective system, an optoelectronic detector device substantially provided in the image plane for detecting the optical image and on basis of the detection outputting output signals, a processor device connected with the detector device for converting and processing the output signals of the detector device in order to reproduce the detected image in digital form and possibly for displaying this in real time on a display device optionally provided in the camera and connected with the processor device, and a memory device connected with the processor device for storing the digital image for displaying on the optional display device which also may be connected with the memory device, or for storing, displaying or possible additional processing on external devices adapted for these purposes and whereto the camera temporarily or permanently is connected.

The present invention also concerns an optoelectronic camera, particularly for recording colour images and even more particularly for recording colour images in an RGB system, comprising an optical objective system for imaging a scene recorded by the camera as an optical image substantially in an image plane of the objective system, an optoelectronic detector device substantially provided in the image plane for detecting the optical image and on basis of the detection outputting output signals, a processor device connected with the detector device for converting and processing the output signals of the detector device in order to reproduce the detected image in digital form and possibly for displaying this in real time on a display device optionally provided in the camera and connected with the processor device, and a memory device connected with the processor device for storing the digital image for displaying on the optional display device which also may be connected with the memory device, or for storing, displaying or possible additional processing on external devices adapted for these purposes and whereto the camera temporarily or permanently is connected. Finally, the present invention concerns a method for digital electronic formatting of a recorded full-format optical image in an optoelectronic camera according to any of the claims 1–32 or any of the claims 33–37, wherein the recorded optical image is stored as a digital image in a memory in a processor device provided in the camera and may be displayed on a display device connected to the processor device.

Very generally the invention concerns optoelectronic cameras which are suited for recording of still images as well as cinematographic images. including video images. The optoelectronic cameras according to the invention are realized such that they can be made as cheap miniature cameras with an extremely flat form factor.

After the launch of charge-coupled components (CCD), electronic photography is being applied in almost all fields in the imaging technology from the most demanding scientific applications such as in astronomical photography with recording of still images under extremely low light intensities and to applications for mass markets such as home video and area surveillance. Up to recently optoelectronic camera devices almost without exception have been based on the use of charge-coupled components (CCD), while other types, for instance charge-injected components (CID) have gained a certain use in particular applications, mostly of scientific nature. The basis for use of CCD for detection and implementation of optoelectronic cameras is extensively discussed in scientific and commercial literature and shall in the following hence be regarded as well-known to persons skilled in the art.

Even if it has been a great success, the CCD technology in optoelectronic cameras causes a number of disadvantages which has a negative effect on the possible use of CCD and miniaturized cheap battery-driven optoelectronic cameras. The silicon-based CCD chip is relatively costly to fabricate, it requires several different drive voltages and consumes relatively much current. In the course of the last years a new class of components called active pixel sensors (APS) has appeared to be strong competitors to the CCD technology, particularly in applications which do not require the absolute maximum image quality. The APS-based optoelectronic detectors can be made with low cost by means of standard CMOS technology and permits integration of a number of functions such as light detection, signal conditioning, power supply and interfacing on the same chip. In addition to the possibility of a very low cost, low power consumption and compact physical realization, the APS detectors may be realized such that processing of the image information is obtained directly on the detector chip, including for instance thresholding, contour determination etc. For certain types of applications APS detectors may give fast random access to the selected pixels or groups of pixels, in contrast with CCD-based detectors which require serial readout of whole rows of pixels at one time.

Commercial applications of APS-based miniature device have emerged within a number of areas, either supplanting other technologies or generating wholly new products. An instance of the first is the use in surveillance cameras, an instance of the latter is the use in toys. Due to the particular properties of the APS detectors recent development has led to optoelectronic cameras with very small dimensions. Such so-called "on chip"-cameras may be obtained commercially from a number of companies, for instance VLSI Vision, Scotland, firms in Sweden and Photobit, U.S.A. A camera which may be accomodated in fountain pen format was recently demonstrated by CSEM, Switzerland.

A common denominator for all optoelectronic camera types is an optical system which creates an acceptable optical image on the light-sensitive detector surface. This poses a problem when it is desired to miniaturize optoelectronic cameras regardless of the type of optoelectronic sensor (CCD, CID, APS, diode array . . . ) to be used. The problem becomes particularly accentuated if the available axial length (the distance along the optical axis from the front of the camera lens and therethrough to the back of the detector chip) of the camera is restricted, i.e. when it is desirable to manufacture a flat camera, as the contribution from the imaging system to this distance is the sum of the lens thickness and the back focal length (BFL), something which indicates that a lenslet or microlens with a very short axial dimension and very short focal length might be used to provide a flat camera solution. However, up to now really flat miniaturized optoelectronic cameras based on this principle have not emerged.

As is to be discussed in the following, the main reason for this substantially is not to be found in the optics used and which generates the optical image. Even if the resolution in the last instance is limited by diffraction, there is another delimiting factor which to a much larger extent finds expression in the present context, namely the restricted spatial resolution which may be obtained in the image plane, particularly with optoelectronic detector arrays. In order to better illuminate the logical step in the development which has led to the present invention, there shall in the following be given a simple basic analysis of the drawbacks of the prior art.

The quality of the optical image will depend on the lens construction and is, as mentioned, in the last instance, limited by diffraction. In order to simplify the analysis it shall be supposed that light is monochromatic green, for instance with a wavelength of 555 nm, and that the lens is very thin and diffraction-limited. The spatial resolution in the image plane is then given by $$w = 0.61 \lambda / N_A \quad (1)$$

wherein $\lambda$ is the light's wavelength and the numerical aperture $N_A$ defined as $$N_A = n \sin\alpha. \quad (2)$$

Here n is the refraction index in the image space and $\alpha$ the half angle of the edge rays in the image space.

The resolution is in principle independent of the physical size of the lens. With realistic values for the numerical aperture $N_A$, the resolution, however, is typically comparable to the light's wavelength. This implies that an image which shall contain M resolved elements ($M = n_x n_y$, where $n_x$ and $n_y$ is the number of resolved elements along respectively the x and y axis) must cover an area in the image plane which cannot be less than $$A = M w^2 = n_x n_y w^2. \quad (3)$$

Here w is the resolution as defined in equation (1) above.

The field of view of the lenses in combination with the linear dimensions $n_x$, w and $n_y$, w for the image defines the focal length of the lens and hence the physical size of the latter. The field of view is defined by the half angle $\theta$ of arrays striking the extreme edge of the optical image, at which location the linear distance to the optical axis is given by $$d/2 = (n_x^2 + n_y^2)^{1/2} \cdot w/2 \quad (4)$$

Denoting the image distance by s', one has $$s' = d/(2 tg\theta) = (n_x^2 + n_y^2)^{1/2} w/(2 tg\theta) \quad (5)$$

For typical imaging cases the focal length for the lens is only slightly less than the image distance s', i.e.

$$f \cong s' \quad (6)$$

If numerical values are inserted for instance $w = 0.5 \mu m$, $n_x = n_y = 10^3$, i.e. $M = 10^6$, $\theta = 19.3°$, one obtains $f \cong s' = 1.01$ mm.

A microlens with this focal length has typically comparable linear dimensions and it will be realized that a truly miniaturized flat camera may be within reach, and offering a resolution of 1 million pixels.

Unfortunately the requirement that the resolution w shall be 0.5 $\mu$m such as defined above for the recording medium in the image plane, is very difficult to realize and far beyond what may be implemented with pixelated optoelectronic image sensors, CCD and APS detectors according to prior art has a pixel pitch at least ten times the resolution w assumed above, something which implies that the focal length and the linear dimensions of the lens shall lie in the range from 10 mm and upwards. Evidently the linear size of the camera depends explicitly of the desired image quality, i.e. on the detail of resolution in the image and of whether it is desirable with a monochromatic image or a full colour image. Hence optoelectronic cameras with dimensions along the optical axis in the range of 1 cm may be implemented. This cannot, however, be regarded as being particularly flat. Smaller dimensions are possible, but entails an impaired image quality. For instances of "on-chip-camera" concepts which exploit CMOS processors to manufacture optoelectronic camera devices with low costs and/or for particular purposes, reference shall be made to literature from e.g. Photobit. U.S.A; IVP, Sweden; VLSI Vision, Great Britain; CSEM, Switzerland; and IMEC, Belgium. For a review of imaging techniques with the use of CMOS-technology, reference may for instance be made to J. Zarnowski & M. Pace, "Imaging options expand with CMOS technology", Laser Focus World, pp. 125–130 (June 1997).

The main purpose of the present invention is to provide an optoelectronic camera which may be used for recording still images, cinematographic images or video images with high image quality and beyond all with high spatial resolution, while the total profile of the camera appears as very flat and the drawbacks which are linked with the above-mentioned prior art are avoided, and then particularly that the image resolution scales with the physical size, particularly the axial length of the optical imaging system.

It is also the object of the invention to provide an optoelectronic camera which may be realized as a relatively thin layer, typically in the size range of 1–3 mm thickness on flat or curved surfaces.

Further it is an object of the invention to provide an optoelectronic camera with a number of specific spatial and spectral imaging characteristics, including controlled resolution of the optical image in one or more areas in the image or along one or more axes in the image plane, an extremely large field of view, including up to a global field ($4\pi$ steradians), spatially resolved chromatic or spectral analysis, full-colour images or imaging in one or more wavelength bands from ultraviolet to infrared and parallaxis-based imaging with the possibility of spatial detection and analysis.

Yet further it is also an object of the invention to provide an optoelectronic camera with imaging solutions which exploit light-detecting elements and circuits realized in optoelectronic technology on large surfaces. Such technology will allow an optoelectronic camera according to the invention to be manufactured with particular low cost. Finally it is a special object of the invention that the optoelectronic camera shall be realized with the use of thin devices based on amorphous or polycrystalline inorganic semiconductors or organic semiconductors based on polymers or oligomers. An example of the application of such material shall be components in the form of flexible plastic sheets, realized as thin cards which may be attached to flat and curved surfaces.

It is also a special object of the present invention to be able to realize ultraminiaturized optoelectronic cameras by using arrays of quasi-monochromatic microlenses as the optical active structures in the camera.

The above objects are realized according to the invention with an optoelectronic camera which is characterized in that the camera objective system is formed by an array of two or more optical active structures (L), that each optical active structure is adapted for generating optical images of the recorded scene on areas of the objective system image plane uniquely assigned to the respective optical active structure, that at least one optoelectronic detector is provided for each optical active structure in its respective assigned area or image plane, all detectors being included in the detector device of the camera, that each detector comprises at least one sensor element uniquely defining a pixel of the optical image, the area of the pixel substantially being determined by the area of the separate defining sensor element, and that each detector is adapted for defining a sample of the optical image with a number of pixels in each sample determined by a number of sensor elements in the defining detector, the digital image optimally being generated by all samples and with a spatial resolution determined by the number of pixels in distinct positions in the optical image defined by the sensor elements.

Advantageously the optical active structures in this connection are refractive structures or diffractive structures or reflective structures or combinations of such structures.

Particular it is advantageous that the refractive or diffractive structures are realized as lenslets with a diameter of at most 3 mm.

It is also advantageous when the total number of distinctly defined pixels in the optical image is equal to the total number of sensor elements in the detector device, such that a one-to-one relation between a given pixel and its defining sensor element in this case is present, whereby the digital image may be generated by a full sampling of the optical image or that the total number of distinctly defined pixels in the optical image is smaller than the total number of sensor elements in the detector device, such that a one-to-many relation between a given pixel and its defining sensor element or sensor elements in this case is present, whereby the digital image may be generated by an oversampling of the optical image. It is advantageous that the optoelectronic camera comprises one or more spatial filters provided in front of the objective system and/or between the objective system and the detector device, said spatial filter perferably being a spatial light-modulator and particular in that connection a controllable electrooptical light-modulator.

It is also advantageous when the optoelectronic camera according to the invention comprises one or more optical filter means provided in front of the objective system and/or between the objective system and the detector device. Preferably the optical filter means then may comprise separate, spectral-selective filters which separately are assigned to either each optical active structure or groups of optical active structures, or to the detector or detectors of the detector device assigned to each optical active structure.

Particularly the optical filter means may be adapted for transmitting in two or more separate wavelength bands by each spectral-selective filter transmitting in a separate wavelength band, the number of filters which transmits in each of the separate wavelength bands substantially being identical. The separate wavelength bands may then preferably be selected such that the optical filter means forms a primary colour filter means or an RGB filter means or such that the optical filter means forms a complementary colour filter means.

In some embodiments the spectral-selective filter advantageously may be realized as a strip filter which is adapted for transmitting in two or more separate wavelength bands by each strip transmitting in a given wavelength band. Preferably each strip in a strip filter may then be assigned to a respective row or column of sensor elements in the detector or detectors and each strip filter may further be realized as a primary colour filter or an RGB filter.

It may according to the invention also be advantageous that the spectral-selective filter is a mosaic filter which is adapted for transmitting in two or more separate wavelength bands by each filter segment in the mosaic filter transmitting in a given wavelength band, the number of filter segments which transmits in each of the wavelength bands substantially being identical, and preferably each filter segments in a mosaic filter then assigned to a respective sensor element or respective sensor elements in the detector or detectors. Particularly may then each mosaic filter preferably be a complementary colour filter.

It is according to the invention advantageous that the detector device comprises detectors realized in one of the following technologies, viz. CCD (charge-coupled device) technology, CID (charge-injected device) technology, APS (active pixel sensor) technology or PMSA (sensor array in passive matrix) technology. Wherein the detector is realized in PMSA technology it is according to the invention advantageous that the detector is realized as a thin-film component or a hybrid component, and that the detector is adapted for parallel read-out of the output signals from the sensor elements over a passive electrode array for unique addressing of each separate sensor element, as the detector in this case preferably may be made wholly or partly of organic semiconducting or electrical isolating materials, including plastic materials and semiconducting oligomers or polymers.

It is according to the invention advantageous that the optical active structures are realized with a determined chromatic aberration or dispersion, such that each optical active structure for two or more separate wavelength bands spectral-selectively generates the optical image in each wavelength band substantially on corresponding substantially congruent image planes superpositioned spaced apart in the ray direction, and that for each optical active structure in each of these image planes a detector for spectral selective detection of the optical image is provided such that for each optical active structure on each image plane a sample in the spatial domain and a sample in the frequency domain are defined, the resolution in the frequency domain substantially being determined by the number of separate wavelength bands with a respective assigned detector, whereby the optical image detected by the detector device may be generated as a multispectral digital colour image with the use of a selected suitable colour system. In that connection it may for each optical active structure preferably be provided three separate superpositioned detectors, respectively in the image plane for three separate wavelength bands assigned to a three-colour system.

Further the above-mentioned objects are realized according to the present invention with an optoelectronic camera which is characterized in that that the camera objective system is formed by an array of two or more optical active structures, that each optical active structure has a determined chromatic aberration or dispersion such that the location of its focal point depends on the wavelength of the light, that each optical structure is adapted for generating spectral-selectively optical images of the recorded scene on areas of three separate superpositioned image planes of the objective system, said areas being uniquely assigned to respective optical active structures, a first image plane forming a first optical image in a wavelength band in the blue portion of the spectrum, and a second image plane a second optical image in a wavelength band in the green portion of the spectrum and a third image plane a third optical image in a wavelength band in the red portion of the spectrum, that for each optical active structure an optoelectronic detector is provided in each of the respective assigned image planes for detection of the optical image generated by the optical active structure in each of the wavelength bands blue, green and red, that each detector comprises at least one sensor element, such that at least one sensor element uniquely defines a pixel of the optical image, the area of the pixel being substantially determined by the area of the separate defining sensor element, that each detector in one of the image planes is adapted for defining a sample of the optical image in the wavelength band corresponding to this image plane and with a number of pixels in each sample determined by the number of sensor elements in the defining detector, the digital image optimally being generated as an RGB colour image with a spatial resolution determined by the number of pixels in distinct, by the sensor elements defined positions in the optical image.

Preferably according to the invention the optical active structures in this case are refractive structures with a determined chromatic aberration or diffractive structures with a determined dispersion or combinations of such structures, and particularly it is then preferred that the refractive or diffractive structures are realized as lenslets with a diameter of at most 3 mm.

Further it is in that connection according to the invention preferred that the total number of distinctly defined pixels in the optical image in one of the wavelength bands is equal to the total number of sensor elements in the detectors for this wavelength band provided in the detector device such that in this case a one-to-one relation between a given pixel and its defining sensor element is present, whereby the digital RGB colour image can be generated with a full sampling of the optical image in each wavelength band and with three times oversampling of the whole optical image in colours.

Finally, a method for digital electronic formatting of a recorded full-format image according to the invention characterized by generating a section or field of the full-format digital image by substantially continuous or stepwise radial or axial contraction of the image towards respectively a convergence point or a convergence axis in the image, the contraction of the image taking place digitally in a data processor provided in the processor device and according to one or more determined pixel-subtracting protocols and being effected by an in-camera or externally provided operating device which is manoeuvred manually by a camera operator and automatically according to predetermined criteria, and by once again expanding formatted field radially or axially in this way stepwise or continuously from respectively the convergence point or from the convergence axis towards a full-format image.

Preferably, according to the invention the formatting may be visualised on the display device, the section or field caused by the formatting at any instant being displayed as a synthetic full-format image on the display device, but with a real spatial resolution given by the corresponding pixel subtraction value of the formatting.

Further, according to the invention a digital electronic zoom function may advantageously be implemented in the camera by the radial contraction or expansion, the field format being determined as respectively a telephoto, wide angle or macro format depending on the distance between the scene and the image plane in the camera, and by a digital electronic pan function being implemented in the camera by the axial contraction or expansion.

Further features and advantages of the present invention are disclosed by the remaining appended dependent claims.

The invention shall now be explained in more detail in the following by means of exemplary embodiments and with the reference to the accompanying drawings, the figures of which are explained in more detail in the immediately succeeding section of the description.

Figure 1B:
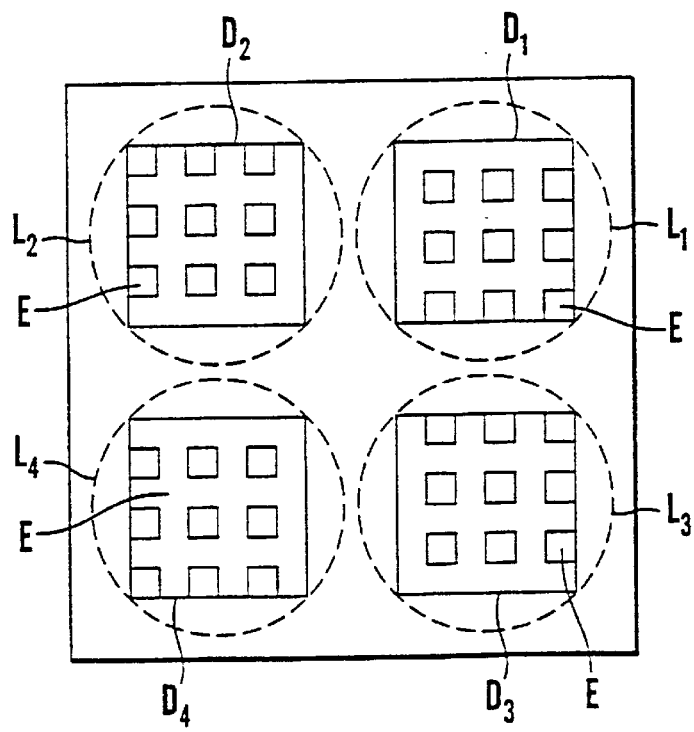
Figure 2A:
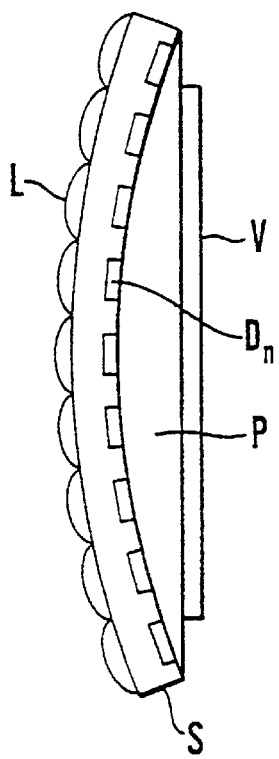
Figure 2B:
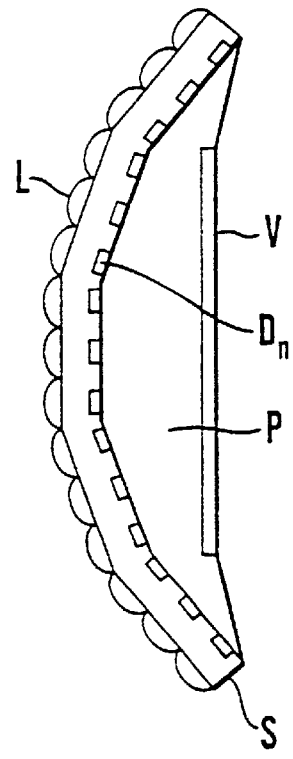
Figure 2C:
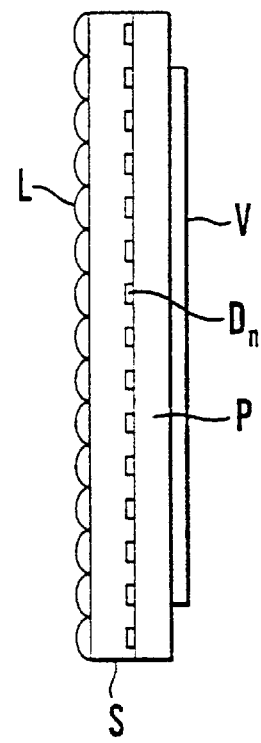
Figure 3A:
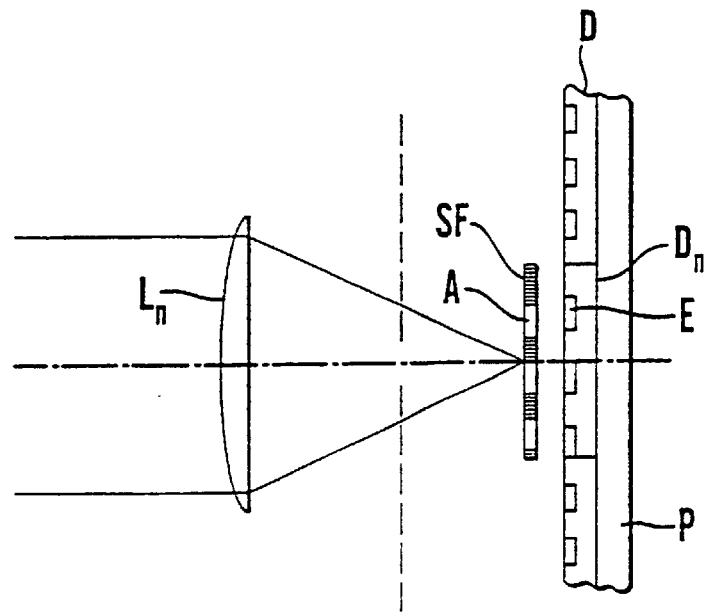
Figure 4A:
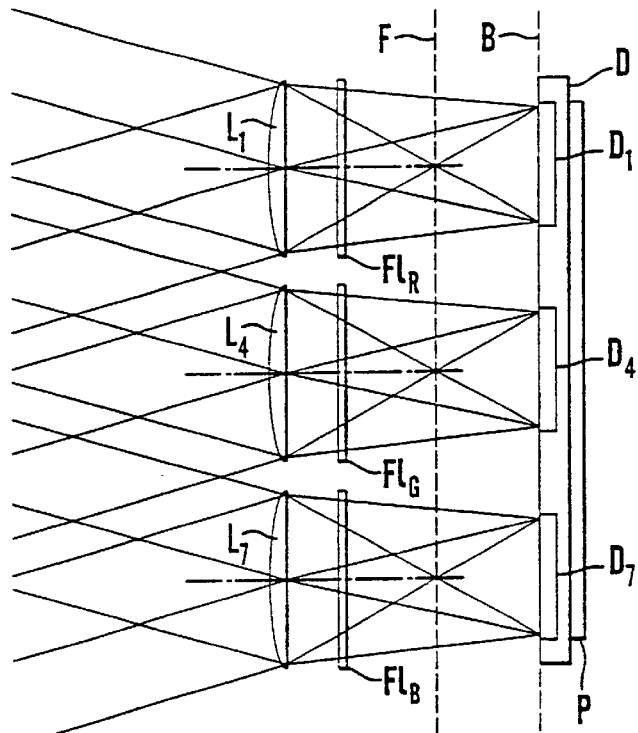
Figure 4B:
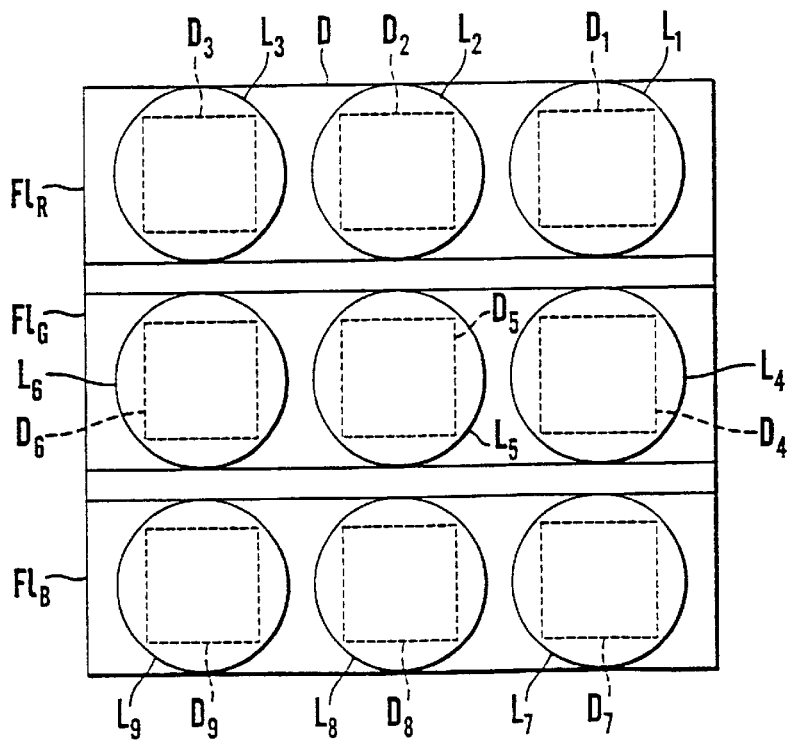
Figure 5A:
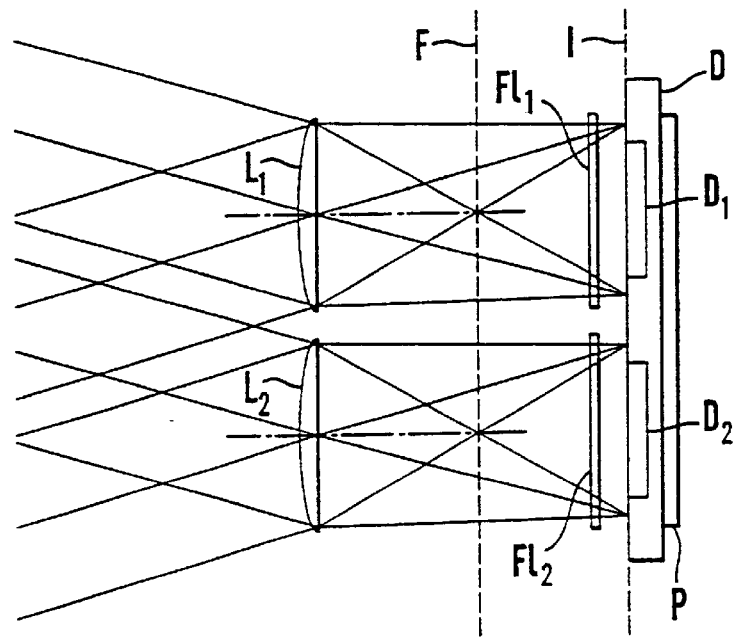
Figure 8:
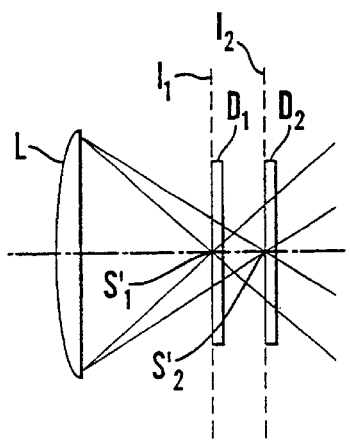
Figure 9A:
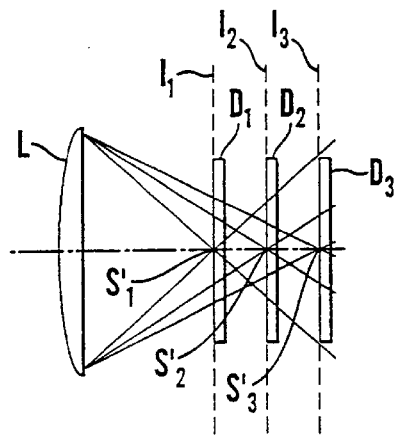
Figure 9B:
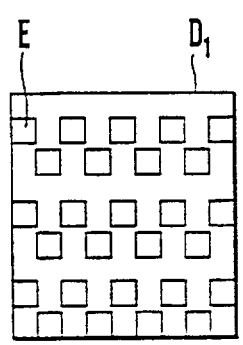
Figure 9B:
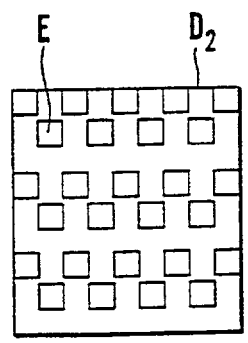
Figure 9B:
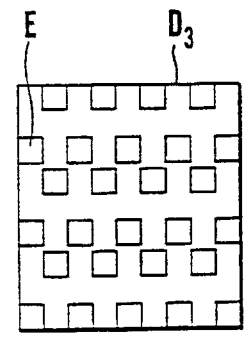
Figure 10A:
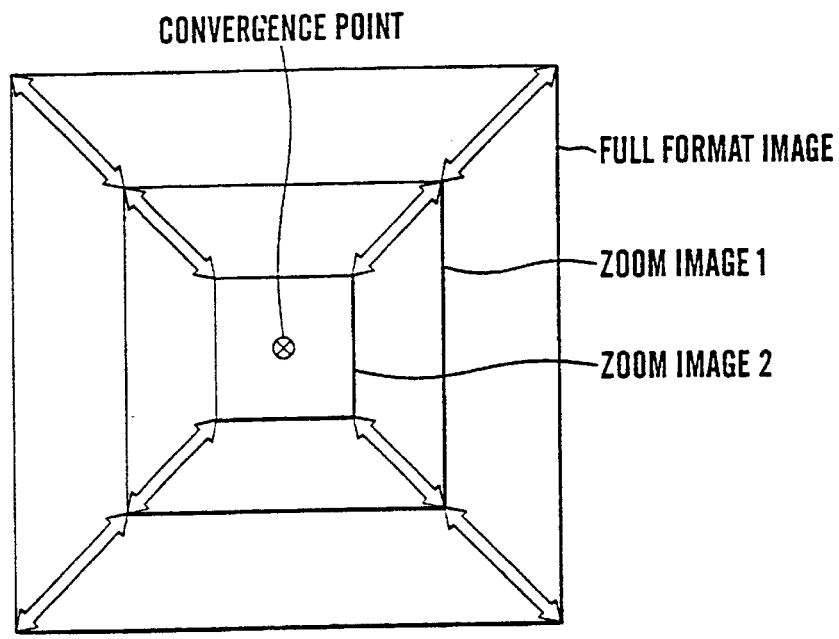
Figure 10B:
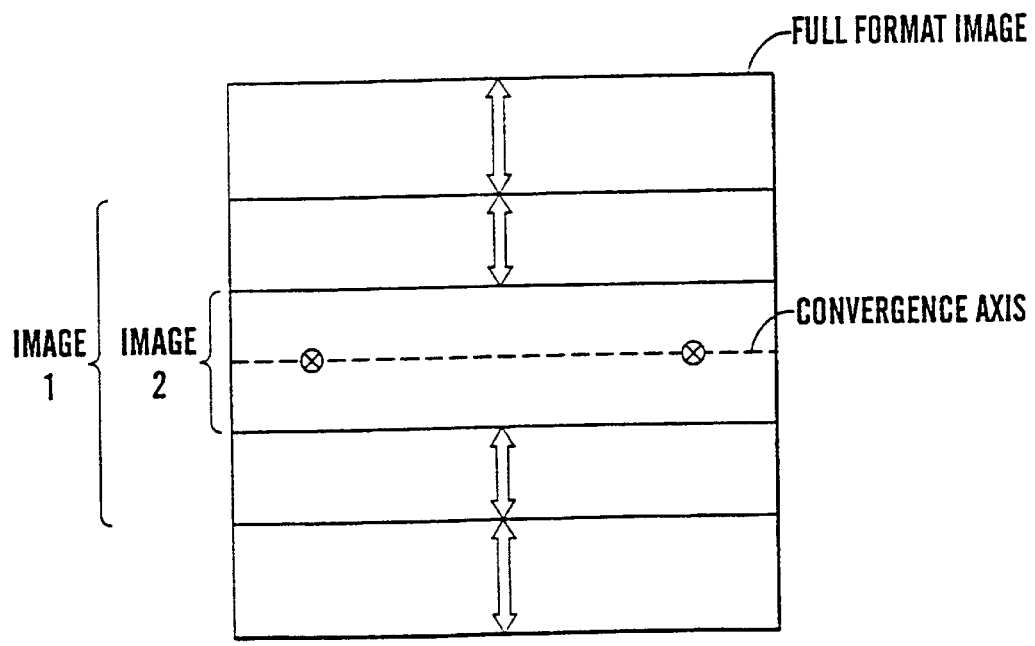

FIGS. 1a, b show schematically a first embodiment of the optoelectronic camera according to the invention, in a side view in FIG. 1a and front view in FIG. 1b, FIGS. 2a–c sections through different variants of the camera according to the invention, FIGS. 3a, b schematically a second embodiment of the camera according to the invention resp. entirely in a side and front view, FIGS. 4a, b schematically a third embodiment of the camera according to the invention, respectively in a side and front view, wherein optical filters are provided, FIGS. 5a, b schematically a corresponding embodiment of the camera as in FIG. 4, respectively in a side view and front view, but wherein the optical filters are provided in a different manner, FIG. 6 an embodiment of a strip filter in an RGB system and as used in the camera according to the invention, FIG. 7 an embodiment of a mosaic filter in a complementary colour system and as used in the camera according to the invention, FIG. 8 schematically a fourth embodiment of the camera according to the invention, in a side view, FIG. 9a schematically a fifth embodiment of the camera according to the invention, FIG. 9b schematically detectors in the embodiment of the camera in FIG. 9a, FIG. 10a the implementation of the zoom function in the camera according to the invention, and FIG. 10b the implementation of a pan function in the camera according to the invention.

The basic concept for the camera according to the invention is shown in FIG. 1 which schematically renders a first embodiment in a side view in FIG. 1a and a front view in FIG. 1b. The camera employs a number of optical active structures, for instance in the form of microlenses or the lenslets L, the camera objective system being shown as an array of four such lenses $L_1-L_4$. Each lens L generates an image of the scene to be imaged with the desired total resolution in the final image. To each of the lenses a detector device is assigned with respective detectors $D_1-D_4$ provided on a back plane P which comprises for instance a processor, a memory etc. and where on the back side of the back plane there may be provided a display V for displaying the recorded image, the display also functioning as a viewfinder. The common image plane I where the detectors $D_1-D_4$ are provided, is rendered spaced apart from the common infinite conjugate focal plane of the lens array, the focal plane F and the image plane I, of course, being coextensive for an image object which is located at infinite distance. Instead of attempting to record all details for the light intensity distribution of the image plane under a single lens with the high-density matrix of light-sensitive sensor elements, which would lead to unrealistic sensor element densities when the lens is small, the present invention employs a partial sampling of the image formed under each of the lenses $L_1-L_4$. In practice each detector $D_1-D_4$ samples via a plurality of sensor elements E in each detector a field of the optical image. In FIG. 1 a single sensor element E is indicated in the detector $D_1$. Totally the detectors $D_1-D_4$ have for instance 36 non-overlapping sensor elements E which pixelate the optical image into 36 pixels. Consequently the sensor elements E also cover the whole area of the optical image such that it is detected by the detectors $D_1-D_4$ such that the partial samples from each of the detectors $D_1-D_4$ together forms a full sample of the image.

For each of the detectors $D_1-D_4$ as shown in FIG. 1b, the sensor elements E form a sub-array in the image plane I of the four assigned lenses $L_1$–$L_4$. The sensor elements E hence determine the sampled areas of the surface of each image plane I of the lenses $L_1$–$L_4$, as these areas mutually are positioned relative to the image such that they complement each other in a composite mosaic picture. It shall be remarked that the density of the sampled areas in the image plane I does not need to be particularly high, as each lens in an array of k lenses only samples 1/k of the total number of resolution elements in the final or composite image. This allows the possibility of using electronic array cameras with moderate-to-low fill factors, as the fill factor is the value which is obtained by dividing the light detecting portion of a pixel area with the total pixel area. In addition to reducing the requirements for the manufacture of a light-sensor chip, a low fill factor also contributes to simplify the inclusion of image processing in the chip.

The optical active structures L do not necessarily need to be lenses, i.e. refractive structures, but may also be diffractive structures or reflective structures or combinations of such structures. If the refractive or diffractive structures are realized as lenslets, they may have a diameter of at most 3 mm and may be provided on a substantially rigid or flexible surface. This surface may be plane, curved or double-curved. For instance the optically active structures or the lenslets L may be provided as in FIGS. 2a–2c, where FIG. 2a shows lenses L on a curved transparent substrate S and assigned detectors $D_n$ provided on the backside of the substrate such that they register with the lenses L. In a backplane P under the detectors $D_n$ (not shown) electronic components may be provided or, as shown, a display V. Correspondingly FIG. 2b shows how the optical active structures or lenses L may be provided on a facetted surface of the substrate S and again with assigned detectors $D_n$, while the backplane P may be provided with a display V and/or not shown electronic components.

FIG. 2c shows the perhaps most preferred embodiment with lenslets L provided on a plane substrate S and with the detectors $D_n$ on the backside thereof. Again a display V and/or not shown electronic components may be provided in or on a backplane P.

Figure 3B:
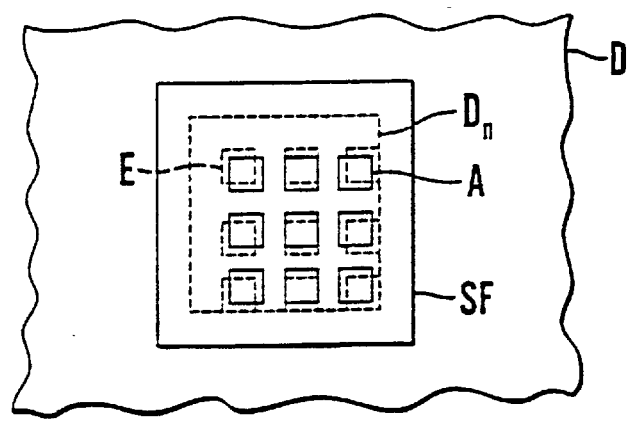

Sampling of specific areas in the image plane I may be achieved in different ways:

An opaque mask with light-transmitting areas or "windows" is provided in the image plane I. Light incident through each window again falls on a dedicated light-sensitive element which is provided under the window. The light-sensitive element is typically larger than the area which is sampled by the window and may be much larger than the latter depending on the number k of the lenses used in the array. This is in practice achieved with the use of a spatial filter SF, such this is shown in FIGS. 3a and 3b. The spatial filter SF is provided between a portion $D_n$ of the detector device D and the lenses L, as shown in section in FIG. 3a and in front view in FIG. 3b. The spatial filter SF has windows or openings A which register optically geometrically either with sensor elements E or with light-sensitive portions in the detector device D. For the sake of simplicity FIG. 3b discloses only a single lens L with an assigned spatial filter SF, the detector device D in practice being realised as a chip with a very large number of sensor elements E or light sensitive portions and assigned to an array of lenses L.

The light-sensitive elements are in themselves formed and located in the image plane such that they perform sampling functions. The areas between each element is not sensitive to light because these areas are inherently insensitive to light or because they are masked by an opaque layer provided directly on the chip surface.

As evident from the above, the number k of lenses must be matched to the density of the light-sensitive areas on the chip surface. This may be a critical bottleneck in the implementation of electronic miniature cameras with flat profile. The minimum number of lenses which is necessary depends on sensor technology desired to use in the camera and the camera's specification with regard to form factor and image quality.

For instance, if it is supposed that a black/white picture shall be recorded and that a lens with resolution w (defocus circle diameter) in the image plane is used, the most compact design is achieved when the effective size of each light-sensitive sensor element in the detector matches the resolution element w of the lens. For the miniature lenses one has typically $w \geq 0.5$ μm. The minimum size of sensor elements in this area may easily be adapted to the present technology for electronic array cameras. The distance between the pixels in the electronic cameras lies typically in the range of 5 μm and above. This may be compared with the required dimensions for the image, viz. $n_x \cdot w$ in the x direction and $n_y \cdot w$ in the y direction, which for a picture with one million pixels and $n_x = n_y = 1000$ becomes 500 μm·500 μm or more. Assuming that the light-sensitive areas of the sensor elements may be positioned with a mutual distance of for instance 10 μm, each lens may accommodate 50·50=2500 pixels, and the minimum number of lenses which is necessary becomes 400. In a quadratic lens array this implies 20·20 lenses.

If the camera according to the invention shall be used for recording colour images, it will with regard to the simplification of manufacturing the camera be desirable to avoid using colour filters which are pixelated with high precision.

FIG. 4a shows in a side view a means in an embodiment of the camera according to the invention with the optical filters between the lens array and the detector device. To each lens $L_1$, $L_2$, . . . there is in this case provided a respective filter $F1_R$, $F1_B$, $F1_G$, each of these filters as shown in front view of FIG. 4b being assigned to respectively groups of three and three lenses $L_1, L_2, L_3$; $L_4, L_5, L_6$; $L_7, L_8, L_9$ in the lens array. The optical filter for three and three lenses is provided for different spectral bands, denoted R, G, B, such that the filters together realizes a system for recording colour images in an RGB system Since each of the lenses L is assigned to a filter with only one colour, all sensor elements in the detector $D_n$ in the image plane of this lens will sample this colour only. The other colour components which are required for a full colour rendering of a given pixel are sampled under the other lenses in a corresponding manner. If an RGB colour system is used in the camera according to the invention consequently three lenses with either an R filter, a G filter or a B filter, in the figure denoted as filters $F1_R$, $F1_B$, $F1_G$ respectively, each samples the spectral band in question in the same portions of the image. As shown in FIG. 4b may this portion be arranged in three separate, but mutually closely adjacent pixel areas, for instance as covered by the detector areas $D_1$, $D_4$, $D_7$ such that a complete overlapping is achieved. An advantage with the embodiment of this kind is that each optical active element or lens only must handle a limited wavelength range and hence may be optimized without the necessity of bothering about chromatic aberrations. In a further embodiment of the invention there are used a number of filters with narrow band-pass, i.e. it is requires more than the minimum number of three or four filters in order to provide a full colour rendering such that the desired spectral range is covered, while the lenses may be optimized without taking chromatic aberrations in regard. This may be of particular importance when using diffractive optics, which may offer structural and cost advantages compared with refractive optics, but which also often have a very large dispersion.

Figure 5B:
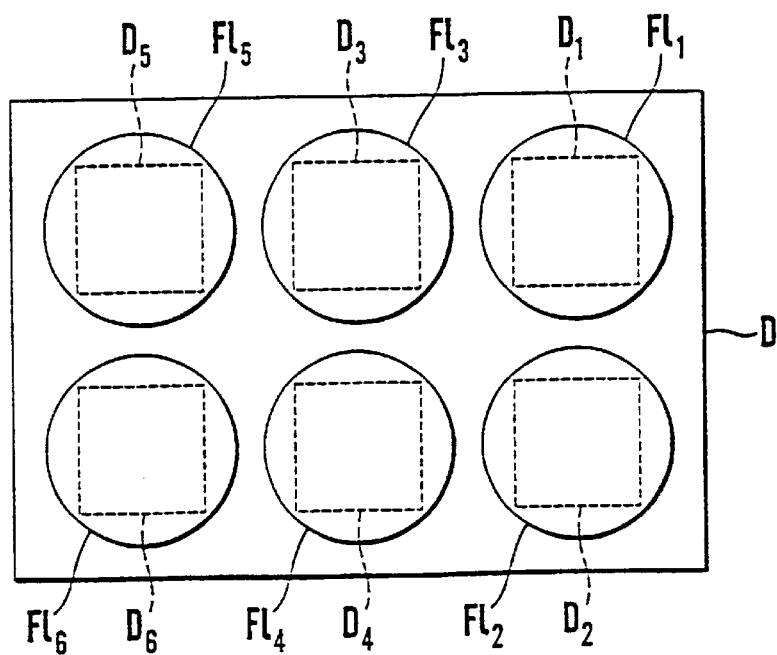

FIGS. 5a, 5b show schematically an embodiment of a camera according to the invention with corresponding filter means as in FIG. 4a and FIG. 4b, but here with the separate optical filters provided immediately before the separate detectors $D_n$ in the detector device D. It shall, of course, be understood that separate detectors $D_n$ as shown in FIGS. 5a and 5b may well be realized integrated on a detector chip and as portions of the chip, while the respective assigned filters F1 each separately may realize colour filters in for instance colour systems such as the RGB system. As shown in FIG. 5b each colour can then be handled by two filters with assigned detectors or detector portions. For instance could the filters $F1_1$ and $F1_2$ with assigned detectors $D_1$ and $D_2$ handle the spectral band for red light the filters $F1_1$ and $F1_2$ then, of course, realizing the R filter.

FIGS. 6 and 7 show different types of filters which may be used in an optoelectronic colour image camera according to the present invention. FIG. 6 shows an embodiment of a strip filter in the RGB system. This filter transmits alternately the red, green and blue spectral bands to the respective assigned groups of detectors. Used in connection with the embodiment in FIG. 5 the colour strips RGB in the strip filter may be assigned to rows of sensor elements in the separate detector. Strip filters provide an excellent colour rendering, but may in some cases cause a reduced image resolution in a determined direction and possibly a reduced photometric response. FIG. 7 shows an embodiment of a mosaic filter in a complementary colour system where the filter consists of a mosaic of colour filters which alternately transmit one of the complementary colours cyan Cy, yellow Ye, green Gr or magenta Mg to the sensor element in a detector or to separately assigned detectors in a detector array. Full colour images are obtained by summing the signals from four adjacent sensor elements or possibly detectors. That is to say that signals from for instance adjacent pairs of linear detectors may be used for generating full colour images. Usually the image resolution and photometric response are better than when using strip filters, but true RGB output signals cannot be obtained using mosaic filters. Corresponding to the strip filters the separate fields in the mosaic filters may separately be assigned to separate detectors, but may also be assigned to sensor elements in a single detector.

FIG. 8 shows an embodiment of the camera according to the invention where the optical active structure of the lens L is given a chromatic aberration or dispersion such that light on different wavelengths $\lambda_1$, $\lambda_2$ is refracted or dispersed to different image points $s_1'$, $s_2'$ in respective image planes $I_1$, $I_2$. In the image planes $I_1$, $I_2$ respective detectors $D_1$, $D_2$ are provided such that a detection of the optical image is obtained in two separate wavelength bands around the wavelengths $\lambda_1$, $\lambda_2$. The first detector $D_1$ must then comprise sensors which are provided such that openings or windows are formed there between in the detector $D_1$ or otherwise the detector $D_1$ in the areas between the sensors must be transparent for light centered around the wavelength $\lambda_2$ which hence reaches the detector $D_2$, is focused to the image plane $I_2$ and there is recorded by the sensors in the detector $D_2$. Each of the detectors $D_1$, $D_2$ will hence record an under-sampled image, with a sampling factor of 0.5, such that the fields recorded by $D_1$, $D_2$ comprises the full sampled image of the scene recorded with the lens L.

If a colour image is desirable, the camera according to the invention may comprise lenses and lens detectors provided as shown in FIG. 9a, which shows a single lens L. This lens L is given a chromatic aberration or dispersion such that light on three different wavelengths $\lambda_1$, $\lambda_2$, $\lambda_3$ are focused to image points $s_1'$, $s_2'$, $s_3'$ in three respective image planes $I_1$, $I_2$, $I_3$. In each image plane a respective detector $D_1$, $D_2$, $D_3$ is provided, preferably with sensor element whose spectral selective sensitivity is adapted respectively to the wavelengths $\lambda_1$, $\lambda_2$, $\lambda_3$. The three superpositioned provided detectors $D_1$, $D_2$, $D_3$ can then combined generate the colour image in an RGB system. The detectors $D_1$, $D_2$ must be realized such that they are transparent for light outside the spectral bands which shall be detected in these detectors.

FIG. 9b shows schematically each of the detectors $D_1$, $D_2$, $D_3$ laterally exploded and in a front view. Each detector is realized with 27 sensor elements and altogether the detector $D_1$, $D_2$, $D_3$ are made with 81 sensor elements, such that full pixel number for the optical image which is imaged by the lens L and detected by the detectors $D_1$, $D_2$, $D_3$ is 81. For each of the wavelengths $\lambda_1$, $\lambda_2$, $\lambda_3$ it is then with the lens L and the three detectors $D_1$, $D_2$, $D_3$ obtained a sampling of the optical image with the sampling factor of ⅓. The full sample RGB image will hence require three lenses with detectors provided as shown in FIG. 9a. Advantageously the detector $D_1$ in the area which is not covered by the sensor elements as shown in FIG. 9b may be made in a material which is transparent to light on the wavelengths $\lambda_2$, $\lambda_3$. Light on the wavelength $\lambda_2$ will hence pass through and be focused to the image plane $I_2$ where the detector $D_2$ is provided. The detector $D_2$ is preferably correspondingly made in a material which is transparent for light on the wavelength $\lambda_3$ such that light on this wavelength may pass through the detector $D_2$ where it is not covered by the sensor element and be focused to the image plane $I_3$ where $D_3$ is provided.

There shall now be given a more detailed description of different optical properties and realizable technical features of the camera according to the invention.

For applications where it is desirable that the camera shall be simple and inexpensive, it may be expedient to use a fixed-focus system, i.e. an optical imaging system without mechanical moving parts. For a lens with focal length f and f' in respectively the object space and image space, the equation for a thin lens may be written $$xx'=ff' \quad (7)$$

Here x and x' is the distance along the optical axis from the infintely conjugate focal points to respectively the object point at s and the image point at s':

$$x=s-f \quad (8)$$

$$x'=s'-f \quad (9)$$

From equations (7), (8) and (9) it is seen that an axial object displacement δs leads to an axial image displacement δs' relative to the image plane, as, if s>>f, $$\delta s' = -ff' \cdot \delta s/s^2 \quad (10)$$

From equation (10) it is seen that the image position becomes less dependent of the object distance s as the latter increases. This relationship is well known to amateur photographers. Further it is seen that for a given object distance s the image position to lesser degree depends on the object distance as the focal lengths f and f' become shorter.

The latter relationship is of special interest in the present connection where the lens has focal lengths two to three magnitudes less than traditional photographic systems. On the other hand the defocus tolerance Δs' of the image plane for diffraction limited optics obeying equation (1) above will be limited by the physical dimensions of the optics, and Δs' shall in the present case be comparable to that which may be attained with traditional photographic systems.

This has a dramatic impact on the depth of field Δs. Assuming for simplicity f≅f', equation (10) may be written $$\Delta s \cong -(s/f)^2 \cdot \Delta s' \quad (11)$$

The depth of field for a given Δs' in other words scales as the inverse square of focal length f. As an example one may consider a camera with fixed focus at infinite, i.e. an image plane with s'=f'=f. If the defocus tolerance in the image plane Δs', the closest object distance $s_{min}$ is then defined by the standard lens equation $$1/s + 1/s' = 1/f \quad (12)$$

which at the object distance s=$s_{min}$ becomes $$1/s_{min} + 1/(f + \Delta s') = 1/f \quad (13)$$

and hence for f>>Δs', $$s_{min} = f^2 / \Delta s' \quad (14)$$

Assuming for instance that f=1 mm, Δs'=1 μm, one consequently obtains $s_{min}$=10³ mm and a camera with fixed focus gives sharply defined images in the focal plane from infinity and down to 1 m. By selecting a nominal optimal focus for a finite distance, i.e. closed than infinity, $s_{min}$ may be further reduced.

If the optoelectronic camera according to the invention is realized with possibilities for digital or software controlled image processing, a number of advantages may be obtained. Particularly it must be remarked that electronic imaging as compared with traditional film-based imaging gives the possibility of a simple and direct manipulation of the image information by means of suitable software before the result, the finished picture, is presented. In certain cases a processing of this kind may be performed directly "on-chip", i.e. in close physical proximity to the detector and with the use of electronic components and circuits integrated with the latter, for instance a CMOS based architecture. Commercial, "camera-on-a-chip" components and systems can now be bought with different types of processing on the chip, including thresholding and correlation analysis between the pixels such as contour definition. Below certain types of image processing which are particular to the present invention shall be discussed.

The basic realization of the optoelectronic camera according to the invention makes it possible to employ light-sensitive detector arrays which extend over a relatively large area and comprise a large number of pixels. This means that two subgroups of pixels may be selected such that they represent sections of a larger picture and hence there may be provided a zoom function, a pan function or motion compensating functions.

FIG. 10a shows how a section of a full-format image may be contracted towards a convergence point in the image. The contraction may take place stepwise or continuously radially by being realized with software control by means of a processor provided in the camera and using a predetermined pixel-subtracting protocol. Section 1 and section 2 in FIG. 10a represent zoom pictures, but with a reduced number of pixels relative to the total number of pixels in the full-format image. If section 1 and section 2 are reproduced on the display, they will be blown up to a format which fills the display and software may then be used for generating the zoom image from a synthetic full-format image, but with the same resolution as the full-format image by interpolating pixels in the enlarged sections, such that the zoom images represented by sections 1 or 2 may appear with seemingly the same resolution as the real full-format image.

FIG. 10b shows how a pan function may be implemented in the camera by allowing the full-format image to contract axially towards a convergence axis, such that different pan image sections 1 and 2 are formed. The convergence axis is in this case the horizontal bisecting line of the full-format image.

In the optoelectronic camera according to the invention it is a particular feature that information is recorded by means of two or more optical systems which are mutually displaced in the lateral direction. For objects which are located closer than infinity, this means that parallax problems may be present. In simple imaging cases the parallax causes a lateral displacement of the image in the image plane relative to the image position for objects at infinity. This displacement varies in a systematic fashion from lens to lens in the array and becomes larger the nearer the camera the object is located. The displacement may in a simple manner be compensated by selecting light-sensitive elements, i.e. sensor elements, which are correspondingly displaced when the image is electronically synthesized. This may be done in different ways. One method is to taking a particular degree of parallax into consideration for all images which are to be synthesized, in which case an optimum object distance is selected for the most relevant imaging task. Another method is correlating different images in the memory of the camera and optimizing the selection of light-sensitive areas for the best resulting image.

It will also be possible to implement an autofocus function wherein the inherent depth of field for an optical system with mechanical fixed focus is insufficient. This can take place in similar manner as mentioned in connection with the parallax compensation, by choosing an optimal object distance for an image to be synthesized. In that connection the inherent parallax error using a lens array, i.e. the displacement of object in the image plane, may be used for a distance measurement.

Finally, specific examples of embodiments of the optoelectronic camera according to the invention shall be discussed.

EXAMPLE 1
Flexible Microlens Camera

Reference is made to one of the FIGS. 2a–2c. The camera is realized as a sandwich with a large number of microlenses 2 located in a thin flexible sheet. The latter is attached to another flexible sheet wherein the detectors $D_n$ are provided in a controlled pattern. The lens sheet may be made of a monolithic piece of plastic material wherein the lenslets are formed by plastic deformation, etching or by depositing a material on a plane substrate. Alternatively a lenslet sheet may comprise a number of individual lenslets immobilised in a flexible, planar matrix.

Plastic detectors provided as arrays on flexible substrates have recently been realized based on the use of conjugated polymers. Responsivity and spectral response are very good and compatible with applications which demand imaging with high quality.

The sandwich construction which realizes the camera may be attached to either plane and/or curved surfaces, for instance for use in areas of surveillance. By for instance curving the sandwich structure into a cylinder, an image field of 360° may be obtained, which will make a mechanical pan function superfluous.

EXAMPLE 2
Camera with Diffractive Microlenses

Reference is made to FIG. 2c, as it is to be understood that each lenslet L is a diffractive lens and in this case with an assigned optical filter with a band-pass range which allows imaging through the diffractive lens without significant chromatic aberrations. In order to obtain spectral coverage over a sufficiently broad wavelength range, a series of lenslets with complementary band-pass filters may be used. The number of band-pass filters may be very large such that a spectral coverage of a broad spectral range is obtained with individual filters which have a very narrow bandwidth. For instance the embodiment as shown in FIG. 2c may in this case practically be implemented as shown in FIGS. 5a and 5b by individual filters being provided behind each lens L, but in front of the assigned detectors $D_n$.

In addition to realizing a very flat surface profile for the camera the use of diffractive lenslets gives large flexibility with regard to controlling the imaging properties of the individually lenses. This allows further improvements of the camera architecture mentioned above. For instance certain lenses in the array may be optimized in order to image chosen peripheral areas of the image, i.e. the rays which enter at a large angle to the optical axis of the camera. By using standard methods for mass production the diffractive lenslet arrays which comprise a very large number of individual lenslets with special properties, may be fabricated cheaply and reliably.

EXAMPLE 3
Ultraminiature Camera

Once again it is supposed that the camera is implemented with a basic structure as in FIG. 2c. In this case detectors in array configuration may be used by employing a passive addressing architecture as disclosed in Norwegian patent application 97 3390 and which hereby is incorporated as reference. This architecture is particularly suited for using light-sensitive polymers in hybrid silicon components, or components wherein the electronic circuits and mechanical supporting elements wholly or partly are made in organic materials.

This makes it possible to form light-sensitive areas in an image plane with an area density which exceeds that which is attainable with electronic light-sensor arrays based on prior art (for instance APS and CCD), by one to two orders of magnitude. This again implies that the number of lenslets which is necessary in order to provide images with high quality can be correspondingly reduced. If a lens handles only one primary colour, this implies in its ultimate consequence that at least three lenslets are required.

As disclosed above the complexity and physical size of these lenses will be greatly reduced compared with achromatic lenses with corresponding modulation transfer function performance (MTF performance), leading to lenses with typical dimensions in 1 mm³ range. Hence it will be possible to realize an optoelectronic full-colour camera with high quality within a total form factor of a few mm³.

What is claimed is:

1. An optoelectronic camera, comprising:
    an optical objective system for imaging a scene recorded by the camera as an optical image substantially in an image plane of the objective system, including:
    an optoelectronic detector device substantially provided in the image plane for detecting the optical image and on basis of the detection outputting output signals, a processor device connected with the detector device for converting and processing the output signals of the detector device in order to reproduce the detected image in digital form, and a memory device connected with the processor device for storing the digital image or for storing, displaying or possible additional processing on external devices adapted for these purposes and whereto the camera may be connected,
    an array of two or more optical active structures, each optical active structure is adapted for generating optical images of the recorded scene on areas of the objective system image plane uniquely assigned to the respective optical active structure,
    wherein at least one optoelectronic detector is provided for each optical active structure in its respective assigned area or image plane, all detectors being included in the detector device of the camera, each detector including at least one sensor element uniquely defining a pixel of the optical image, the area of the pixel substantially being determined by the area of the separate defining sensor element, wherein each detector is adapted to define a sample of the optical image with a number of pixels in each sample determined by a number of sensor elements in the defining detector, the digital image optimally being generated by all samples and with a spatial resolution determined by the number of pixels in distinct positions in the optical image defined by the sensor elements, wherein the ratio between the sensor element area of the detector with a total of the detector area is substantially less than 1.

2. Optoelectronic camera according to claim 1,
    wherein the optical active structures are refractive structures or diffractive structures or reflective structures or combinations of such structures.

3. Optoelectronic camera according to claim 2,
    wherein the refractive or the diffractive structures are formed as lenslets with a diameter of at most 3 mm.

4. Optoelectronic camera according to claim 1,
    wherein the objective system with the optical active structures forms a substantially rigid or flexible surface.

5. Optoelectronic camera according to claim 4,
    wherein the substantially rigid or flexible surface is a plane, curved or double-curved surface.

6. Optoelectronic camera according to claim 1,
    wherein each detector comprises an array of two or more sensor elements such that each sensor element in the array defines a spatially distinct pixel in the optical image.

7. Optoelectronic camera according to claim 1,
    wherein the sensor elements all have identical form factor, and that the area of the optical image expressed in pixels hence is given by the ratio between the geometric area of the optical image and the geometric area of a single sensor element.

8. Optoelectronic camera according to claim 1,
    wherein the total number of distinctly defined pixels in the optical image is equal to the total number of sensor elements in the detector device, such that a one-to-one relation between a given pixel and its defining sensor element is present, whereby the digital image may be generated by a full sampling of the optical image.

9. Optoelectronic camera according to claim 1,
    wherein the total number of distinctly defined pixels in the optical image is smaller than the total number of sensor elements in the detector device, such that a one-to-many relation between a given pixel and its defining sensor element or sensor elements is present, whereby the digital image may be generated by an oversampling of the optical image.

10. Optoelectronic camera according to claim 1,
wherein two or more detectors define identical spatial samples of the optical image.

11. Optoelectronic camera according to claim 1,
further comprising: one or more spatial filters provided in front of the objective system and/or between the objective system and the detector device.

12. Optoelectronic camera according to claim 11,
wherein the spatial filter is a spatial light modulator.

13. Optoelectronic camera according to claim 12,
wherein the spatial light modulator is a controllable electrooptical light modulator.

14. Optoelectronic camera according to claim 1,
further comprising: one or more optical filter means provided in front of the objective system and/or between the objective system and the detector device.

15. Optoelectronic camera according to claim 14,
wherein the optical filter means comprises separate, spectral selective filters which separately are assigned to either each optical active structure or groups of optical active structures, or to the detector or detectors of the detector device assigned to each optical active structure.

16. Optoelectronic camera according to claim 15,
wherein the optical filter means is adapted for transmitting in two or more separate wavelength bands by each spectral-selective filter transmitting in a separate wavelength band, the number of filters which transmit in each of the separate wavelength bands substantially being identical.

17. Optoelectronic camera according to claim 16,
wherein the separate wavelength bands in adjacent or not adjacent bandwidth relationship combined at least cover the visual part of the spectrum.

18. Optoelectronic camera according to claim 16,
wherein the separate wavelength bands are selected such that the optical filter means forms a primary colour filter means or an RGB filter means.

19. Optoelectronic camera according to claim 16,
wherein the separate wavelength bands are selected such that the optical filter means forms a complementary colour filter means.

20. Optoelectronic camera according to claim 17,
wherein the spectral-selective filters of the filter means separately are assigned or superpositioned to the detector or detectors provided for each optical active structure, and
wherein the spectral-selective filter is a strip filter which is adapted for transmitting in two or more separate wavelength bands by each strip transmitting in a given wavelength band, the number of strips which transmits in each of the wavelength bands substantially being identical.

21. Optoelectronic camera according to claim 10,
wherein each strip in a strip filter is assigned to a respective row or column of sensor elements in the detector or detectors.

22. Optoelectronic camera according to claim 20,
wherein each strip filter is a primary colour filter or an RGB filter.

23. Optoelectronic camera according to claim 15, wherein the spectral-selective filters of the filter means separately are assigned or superpositioned to the detector or detectors provided for each optical active structure, and the spectral selective filter is a mosaic filter which is adapted for transmitting in two or more separate wavelength bands by each filter segment in the mosaic filter transmitting in a given wavelength band, the number of filter segments which transmit in each of the wavelength bands substantially being identical.

24. Optoelectronic camera according to claim 23,
wherein each filter segment in the mosaic filter is assigned to a respective sensor element or respective sensor elements in the detector or detectors.

25. Optoelectronic camera according to claim 23,
wherein each mosaic filter is a complementary colour filter.

26. Optoelectronic camera according to claim 1,
wherein the detector device comprises detectors realized in one of the following technologies, viz. CCD (charge-coupled device) technology, CID (charge-injected device) technology, APS (active pixel sensor) technology or PMSA (sensor array in passive matrix) technology.

27. Optoelectronic camera according to claim 26, wherein the detector is realized in PMSA technology, and the detector is realized as a thin-film component or a hybrid component, and that the detector is adapted for parallel read-out of the output signals from the sensor elements over a passive electrode array for unique addressing of each separate sensor element.

28. Optoelectronic camera according to claim 27,
wherein the detector is made wholly or partly of organic semiconducting or electrical isolating materials, including plastic materials and semiconducting oligomers or polymers.

29. Optoelectronic camera according to claim 28,
wherein the organic materials wholly or partly transmit light in at least the visual part of the spectrum, and that the detector in the area between its sensor elements is transparent or translucent in this spectral range.

30. Optoelectronic camera according to claim 28,
wherein the electrode array of the detector wholly or partly is transparent or translucent in at least the visual range of the spectrum.

31. Optoelectronic camera according to claim 1,
wherein the optical active structures are realized with a determined chromatic aberration or dispersion, such that each optical active structure for two or more separate wavelength bands spectral-selectively generates the optical image in each wavelength band substantially on corresponding substantially congruent image planes superpositioned spaced apart in the ray direction, and that for each optical active structure in each of these image planes a detector for spectral-selective detection of the optical image is provided such that for each optical active structure on each image plane a sample in the spatial domain and a sample in the frequency domain are defined, the resolution in the frequency domain substantially being determined by the number of separate wavelength bands with a respective assigned detector, whereby the optical image detected by the detector device may be generated as a multispectral digital colour image with the use of a selected suitable colour system.

32. Optoelectronic camera according to claim 31,
wherein three separate superpositioned detectors are provided for each optical active structure, respectively in the image plane for three separate wavelength bands assigned to a three-colour system.

33. Optoelectronic camera, particularly for recording colour images and even more particularly for recording colour images in an RGB system, comprising an optical objective system for imaging a scene recorded by the camera as an optical image substantially in an image plane of the objective system, an optoelectronic detector device substantially provided in the image plane for detecting the optical image and on basis of the detection outputting output signals, a processor device connected with the detector device for converting and processing the output signals of the detector device in order to reproduce the detected image in digital form and possibly for displaying this in real time on a display device optionally provided in the camera and connected with the processor device, and a memory device connected with the processor device for storing the digital image for displaying on the optional display device which also may be connected with the memory device, or for storing, displaying or possible additional processing on external devices adapted for these purposes and whereto the camera temporarily or permanently is connected, wherein the camera objective system is formed by an array of two or more optical active structures, each optical active structure has a determined chromatic aberration or dispersion such that the location of its focal point depends on the wavelength of the light, each optical structure is adapted for generating spectral-selectively optical images of the recorded scene on areas of three separate superpositioned image planes of the objective system, said areas being uniquely assigned to respective optical active structures, a first image plane forming a first optical image on a wavelength band in the blue portion of the spectrum, and a second image plane forming a second optical image on a wavelength band in the green portion of the spectrum and a third image plane forming a third optical image on a wavelength band in the red portion of the spectrum, that for each optical active structure an optoelectronic detector is provided in each of the respective assigned image planes for detection of the optical image generated by the optical active structure in each of the wavelength bands blue, green and red, that each detector including at least one sensor element, such that at least one sensor element uniquely defines a pixel of the optical image, the area of the pixel being substantially determined by the area of the separate defining sensor element, that each detector in one of the image planes is adapted for defining a sample of the optical image in the wavelength band corresponding to this image plane and with a number of pixels in each sample determined by the number of sensor elements E in the defining detector ($D_n$), the digital image optimally being generated as an RGB colour image with a spatial resolution determined by the number of pixels, by the sensor elements defined positions in the optical image.

34. Optoelectronic camera according to claim 33, wherein the optical active structures are refractive structures with a determined chromatic aberration or diffractive structures with a determined dispersion or combinations of such structures.

35. Optoelectronic camera according to claim 34, wherein the refractive or diffractive structures are realized as lenslets with a diameter of at most 3 mm.

36. Optoelectronic camera according to claim 33, wherein the total number of distinctly defined pixels in the optical image in one of the wavelength bands is equal to the total number of sensor elements in the detectors for this wavelength band provided in the detector device such that in this case a one-to-one relation between a given pixel and its defining sensor element is present, whereby the digital RGB colour image can be generated with a full sampling of the optical image in each wavelength band and with three times oversampling of the whole optical image in colours.

37. Optoelectronic camera according to claim 33, wherein the total number of distinctly defined pixels of the optical image in one of the wavelength bands is smaller than the total number of sensor elements in the detectors for this wavelength band provided in the detector device, such that in this case a one-to-many relation between a given pixel and its defining sensor element or sensor elements in this case is present, whereby the digital RGB colour image can be generated with an oversampling in each wavelength band and with a total oversampling of the optical image equal to the sum of the oversampling factor in each wavelength band.

38. A method for digital electronic formatting of a recorded full-format optical image in an optoelectronic camera according to claim 1, wherein the recorded optical image is stored as a digital image in a memory in a processor device provided in the camera and may be displayed on a display device connected to the processor device, further comprising, generating a section or field of the full-format digital image by substantially continuous or stepwise radial or axial contraction of the image towards respectively a convergence point or a convergence axis in the image, the contraction of the image taking place digitally in a data processor provided in the processor device and according to one or more determined pixel-subtracting protocols and being effected by an in-camera or externally provided operating device which is manoeuvred manually by a camera operator and automatically according to predetermined criteria, and by once again expanding formatted field radially or axially in this way stepwise or continuously from respectively the convergence point or from the convergence axis towards a full-format image.

39. A method according to claim 38, wherein the formatting is visualised on the display device, the section or field caused by the formatting at any instant being displayed as a synthetic full-format image on the display device, but with a real spatial resolution given by the corresponding pixel subtraction value of the formatting.

40. A method according to claim 38, wherein a digital electronic zoom function is being implemented in the camera by the radial contraction or expansion, the field format being determined as respectively a telephoto, wide angle or macro format depending on the distance between the scene and the image plane in the camera, and by a digital electronic pan function being implemented in the camera by the axial contraction or expansion.

41. Method according to claim 38, wherein the convergence point and the convergence axis default automatically and are chosen respectively by the intersection between the optical axis and the image plane or the horizontal bisecting line of the image plane, and by the convergence point and the convergence axis being manually selected over the operating device as respectively an arbitrary point or an arbitrary axis of the image.

42. The optoelectronic camera of claim 1, wherein the detected image is displayed in real time on a display device provided in the camera and connected with the processor device.

* * * * *